United States Patent [19]

Kushi et al.

[11] Patent Number: 5,356,754
[45] Date of Patent: Oct. 18, 1994

[54] CROSSLINKING CURABLE RESIN COMPOSITION

[75] Inventors: Kenji Kushi; Ken-ichi Inukai; Takayuki Iseki; Seiya Koyanagi, all of Otake, Japan

[73] Assignee: Mitsubishi Rayon Co., Ltd., Tokyo, Japan

[21] Appl. No.: 950,500

[22] Filed: Sep. 25, 1992

[51] Int. Cl.$^5$ .............................................. G03C 1/73
[52] U.S. Cl. ................................... 430/288; 430/271; 430/281; 430/286; 522/114; 522/121
[58] Field of Search ............... 430/288, 281, 286, 271; 522/114, 121

[56] References Cited

U.S. PATENT DOCUMENTS 5,164,277 11/1992 Hiria .................................... 430/288

FOREIGN PATENT DOCUMENTS 0382524 8/1990 European Pat. Off. .

OTHER PUBLICATIONS

Database WPIL, Derwent Publications Ltd., AN-9-2-288948 & JP-A-4 198 207, Jul. 17, 1992.

Primary Examiner—Jack P. Brammer
Attorney, Agent, or Firm—Oblon, Spivak, McClelland, Maier & Neustadt

[57] ABSTRACT

A photopolymerizable or radiation polymerizable alkaline developing crosslinking curable resin composition possessing superior antiplating properties and a short stripping period, in which the stripped plate is not easily dissolved in the stripping fluid, and which is comprising:

(a) 5–30 parts by weight of at least one compound possessing in one molecule on the average 1.5 or more (meth)acryloyloxy groups, which is obtained by reacting (meth)acrylic acid with a reaction product formed by adding, to a polyatomic alcohol possessing 3 or more OH groups in one molecule, an alkylene oxide containing propylene oxide in an amount of 67% molar or greater in an amount of 5–12 moles per mole of OH group in the aforementioned polyatomic alcohol, (b) 5–30 parts by weight of at least one crosslinkable monomer other than that stated above in (a), possessing in one molecule 2 or more ethylenically unsaturated groups, (c) 45–75 parts by weight of a thermoplastic polymer for use as a binder, the thermoplastic polymer in turn being formed of 15–35 wt % of at least one α,β-unsaturated carboxyl group containing a monomer having 3–15 carbon atoms, and 65–85 wt % of another copolymerizable monomer, and (d) 0–10 parts by weight of a photopolymerization initiator.

5 Claims, No Drawings

CROSSLINKING CURABLE RESIN COMPOSITION

BACKGROUND OF THE INVENTION

1. Field of the Invention

The present invention relates to a photopolymerizable or radiation polymerizable resin composition which can be developed by means of alkaline solution.

2. Description of the Related Art

In recent years, a so-called dry film resist, consisting of a photopolymerizable resin layer sandwiched between a supporting film layer and a protective film layer, has come into widespread use as a photo-resist used in the manufacture of printed circuit boards. As the photopolymerizable resin layer, solvent developing resins, in which portions unexposed to light are removable by treatment with a chloro-organic solvent, and alkaline developing resins, in which unexposed portions thereof are removable by treatment with an alkaline aqueous solution, are known. However, due to environmental as well as manufacturing cost considerations, alkaline developing dry film resists have come to be the most widely employed.

The method of use for the alkaline developing dry film resist possessing a supporting film layer and a protective film layer consists of the following. First, while stripping away the protective film layer from the dry film resist, the surface of the photopolymerizable resin layer is heat laminated onto a copper foil laminated sheet. Following this, a photo-tool is brought into tight contact with the surface of the supporting film of the film resist, after which exposure curing of the parts to be cured is performed with ultraviolet rays and the like. After the supporting film is peeled away, development proceeds with the removal of unexposed portions by means of weak alkali aqueous solutions such as sodium carbonate, producing a resist circuit pattern. Following this, in the case of the copper through-hole procedure, after carrying out etching of the copper surface, the cured resist is peeled a way using a strong alkali aqueous solution such as sodium hydroxide, producing a printed circuit board. Additionally, in the case of the solder through-hole procedure, after performing copper and solder plating, the cured resist is stripped using a strong alkali aqueous solution, and the exposed copper is further etched, producing the printed circuit board.

When comparing the solder through-hole procedure to the copper through-hole procedure, the thickness of the copper removed after etching is thin, and as a result, there is little thinning of the copper pattern by unnecessary side etching, making this procedure appropriate for the manufacturing of fine patterns.

When forming a circuit pattern using the solder through-hole procedure, it is essential that the dry film resist possess a sufficient resistance as a plating resist. However, with most of the conventional alkaline developing dry films, the cured resist peels off during copper or solder plating, and plating fluid soaks in between the cured resist and the copper surface. Accordingly, frequent incidence of the so-called "submerged plating" phenomenon in which portions outside of the circuit portion are also plated, as well as a number of other problems such as short-circuiting of the conductor, enlargement of the conductor width and disruption of the shape of the conductor periphery portion also occur.

As a result, various investigations have been carried out in order to improve the antiplating properties. However, in most of the alkaline developing dry film resists with improved antiplating properties, improving the chemical resistance of the composition was established as the main goal in order to increase the antiplating properties, and as a result, although the cured resist was stripped by a strong alkaline aqueous solution, a drawback existed in that a long time (stripping time) was required for this operation. If the stripping time is long, the time required for manufacturing the circuit pattern becomes longer, and not only is there no increase in productivity, but also the copper surface of the substrate is oxidized by the alkali and discolored and is further detrimentally affected in the etching process. Optionally, the solder was dissolved by means of immersion for an extended period of time in a strong alkaline aqueous solution, giving rise, during the etching process, to thinning of the pattern and disconnection, as well as elimination of fading.

Most of the conventional alkaline developing dry film resists possessing a short stripping time not only have insufficient antiplating properties, but are also disadvantageous in that the stripped plate of the cured resist, stripped by means of a stripping fluid with strong alkali properties is easily dissolved in the same stripping fluid. If the stripped plate of the cured resist is easily dissolved in the stripping fluid, this stripped plate, during retention in the stripping tank, swells easily, acquiring a gel-like form. This gel-like substance then sticks to the stripped plate, resulting in clogging of the filter provided in the stripping machine. This in turn results in reduction of the circulation amount of the stripping fluid, and hence stripping of the cured resist becomes impossible, and also results in overflow of the stripping fluid from the stripping tank, and contamination of the periphery of the tank.

SUMMARY OF THE INVENTION

The purpose of the present invention is to provide a photopolymerizable or radiation polymerizable alkaline developing crosslinking curable resin composition possessing superior antiplating properties and a short stripping time, in which the stripped plate is not easily dissolved in the stripping fluid.

The present invention provides a crosslinking curable resin composition of a combined gross weight of 100 parts by weight comprising the following:

(a) 5–30 parts by weight of at least one compound possessing in one molecule on the average 1.5 or more (meth)acryloyloxy groups, which is obtained by reacting (meth)acrylic acid or (meth)acrylic acid chloride with a reaction product formed by adding, to a polyatomic alcohol possessing 3 or more OH groups in one molecule, an alkylene oxide of propylene oxide singly or formed from a combination of propylene oxide and ethylene oxide, with propylene oxide incorporated in the amount of 67% molar or greater, in the amount of 5–12 moles per mole of OH group in the aforementioned polyatomic alcohol, (b) 5–30 parts by weight of at least one cross linkable monomer other than that stated above in (a), possessing in one molecule 2 or more ethylenically unsaturated groups, (c) 45–75 parts by weight of a thermoplastic polymer for use as a binder, the thermoplastic polymer in turn being formed of 15–35 wt % of at least one $\alpha,\beta$- unsaturated carboxyl group containing a monomer having 3–15 carbon atoms, and 65–85 wt % of another copolymerizable monomer, and (d) 0–10 parts by weight of a photopolymerizable initiator.

The crosslinking curable resin composition of the present invention is characterized by having superior antiplating properties and a short stripping time in addition to a short developing time, in which the stripped plate does not easily dissolve in the stripping fluid.

When using the aforementioned composition as a resist, the composition readily conforms with irregularities in the substrate, and during copper or solder plating there is no occurrence of the submerged plating phenomenon. Additionally, problems such as short-circuiting of the conductor, enlargement of the conductor width and disruption of the shape of the conductor periphery portion also do not occur. Furthermore, because the stripping time in the alkali aqueous solution is short, the productive efficiency can be increased. And problems such as oxidation, thinning of the solder pattern and disconnection can be prevented. As well, since the stripped plate of the cured resist does not dissolve in the stripping fluid during stripping, problems such as clogging of the stripping machine filter, lowering of the circulation amount and overflowing of the fluid can be eliminated. As a result, the present invention provides a superior alkaline developing photopolymerizable or radiation polymerizable crosslinking curable resin composition.

DETAILED DESCRIPTION OF THE INVENTION

Accordingly, a crosslinking curable resin composition is provided by the present invention comprising 5–30 parts by weight of at least one type of compound possessing in one molecule on the average of 1.5 or more (meth)acryloyloxy groups, which is obtained by reacting (meth)acrylic acid or (meth)acrylic acid chloride with a reaction product formed by adding, to a polyatomic alcohol possessing 3 or more OH groups in one molecule, an alkylene oxide of propylene oxide singly or formed from a combination of propylene oxide and ethylene oxide, with propylene oxide incorporated in the amount of 67% molar or greater, in the amount of 5–12 moles per mole of OH group in the aforementioned polyatomic alcohol.

As the polyatomic alcohol, any polyatomic alcohol possessing 3 or more OH groups in one molecule can be used: as specific examples, there can be mentioned glycerin, trimethylol methane, trimethylol ethane, trimethylol propane, pentaerythritol and the like. As well, multiple mole condensation compounds of these examples such as trimethylol ethane dimers, trimethylol propane dimers, pentaerythritol dimers and the like can also be used. Additionally, it is also possible that other OH groups may be substituted with alkoxy groups, acyloxy groups and the like, if 3 or more OH groups in each molecule of the polyatomic alcohol are retained.

Propylene oxide singly or a combination of propylene oxide and ethylene oxide can be used as the alkylene oxide to be reacted with the aforementioned polyatomic alcohol; however in the case of combining propylene oxide and ethylene oxide, the molar ratio of propylene oxide incorporated must be 67% or greater. If the molar ratio of propylene oxide is less than 67%, the stripped plate becomes easily dissolved in the stripping liquid. Additionally, when giving serious consideration to the developing speed of the crosslinking curable resin composition, it is preferred that the ratio of the propylene oxide incorporated be in the range of 67–90%. In the case when the molar ratio of propylene oxide incorporated is 67–90%, the developing speed is increased by 20% or more when compared to the case when the molar ratio exceeds 90%; thus the above mentioned range is most preferred. As well, when combining propylene oxide and ethylene oxide it is possible to add and react the mixture of propylene oxide and ethylene oxide to the aforementioned polyatomic alcohol randomly; however, it is most preferred to add first the propylene oxide alone, and then add the ethylene oxide afterwards.

When considering cost, reaction of propylene oxide singly is preferred. Namely, this is due to the fact that when using a combination of propylene oxide and ethylene oxide, the manufacturing process becomes complex and cost efficiency is lowered.

The number of moles of alkylene oxide added to react with the polyatomic alcohol is within a range of 5–12 per 1 mole of OH group of the polyatomic alcohol. It is a able to add alkylene oxide in an amount of 5–12 moles per 1 mole of OH group of the polyatomic alcohol to be reacted, and it is acceptable if the number of alkylene oxide molecules added to 1 OH group differs among the OH groups in the polyatomic alcohol. Dry film resists obtained using a (meth)acrylate compound in which the number of moles of alkylene oxide added is less than 5 moles per 1 mole of OH group do not possess superior antiplating properties, and furthermore, there is a tendency for the stripping time by means of a strong alkali aqueous solution to be long. On the other hand, dry film resist obtained using a (meth) acrylate compound in which the number of moles of alkylene oxide added exceeds 12 moles per 1 mole of group yield cured material in which the crosslinking density is too low, resistance to chemicals is reduced, and the loss of the developed surface is lost.

In a reaction product obtained by the addition of 5–12 moles of alkylene oxide per 1 mole of OH group of polyatomic alcohol and reaction with this polyatomic alcohol, it is necessary that the compound obtained by means of reacting (meth)acrylic acid or (meth)acrylic acid chloride contain in one molecule on the average 1.5 or more (meth)acryloyloxy groups. If the (meth)acryloyloxy groups contained in this compound are not present in an average amount of at least 1.5 per molecule, the resulting dry film resist cured product will have a crosslinking density which is too low, the resistance to chemicals thereof will be decreased, and, when developed, the gloss of the surface will be lost. Furthermore, it is possible to mix and use 2 or more compounds possessing, on average, more than 1.5 (meth)acryloyloxy groups per molecule obtained from polyatomic alcohol.

As stated above, it is necessary in the present invention to combine in specific proportions at least one crosslinking monomer (b) having at least 2 ethylenically unsaturated groups in each molecule, binder thermoplastic polymer (c) containing carboxyl groups, photopolymerization initiator (d), and a compound (a) obtained by reacting (meth)acrylic acid or (meth)acrylic acid chloride with a reaction product obtained by adding and reacting 5–12 moles of alkylene oxide per 1 mole of OH groups with a polyatomic alcohol having 3 or more OH groups per molecule, this compound (a) having, on average, 1.5 or more (meth)acryloyloxy groups per molecule. By mixing a specified amount of the specified (meth)acrylate compound (a) obtained from the polyatomic alcohol possessing 3 or more OH groups per 1 molecule, it is possible to simultaneously achieve superior antiplating characteristics, ease of stripping, and resistance to dissolving of the stripped plate, which could not be achieved with conventional technology.

The details of the mechanism have not be sufficiently explained; however, it is believed that, as a result of the fact that the crosslinking curable resin composition has a crosslinking density which is appropriately loose and cures evenly as a result of the use of a specified amount of the above-specified (meth)acrylate compound (a) obtained from polyatomic alcohol having 3 or more OH groups per molecule, the residual stress in the resulting cured membrane is small, the resulting cured membrane is extremely flexible and possesses flexibility sufficient to withstand various forces applied to the plating resist during the plating deposition reaction, and thereby the antiplating characteristics are improved. Furthermore, by means of the use of specified amounts of a specified (meth)acrylate compound (a) obtained from polyatomic alcohol having 3 or more OH groups per molecule, a loose network is formed at the time of the curing of the crosslinking curable resin composition, so that the penetration of the alkali aqueous solution within the cured membrane is fostered, and the ease of stripping is improved. Furthermore, the specified (meth)acrylate compound (a) obtained from polyatomic alcohol possessing 3 or more OH groups per molecule has an appropriately long polypropylene glycol chain and thus possesses hydrophobic properties, so that the dissolution capability of a crosslinking curable resin composition obtained by using a specific amount of this compound in an alkaline aqueous solution is reduced, and the stripped plate remains undissolved.

The specified (meth)acrylate compound (a) obtained from polyatomic alcohol having 3 or more OH groups per molecule to be used in the present invention is contained in an amount of 5-30 wt % of the crosslinking curable resin composition of the present invention. If the amount of this (meth)acrylate compound (a) contained in the crosslinking curable resin composition is less than 5 wt %, the superior antiplating properties which are an object of the present invention cannot be obtained, while in the case in which a composition containing more than 30 wt % of the compound (a) is used as the dry film resist, the gloss of the surface is lost when development is carried out by means of an alkaline aqueous solution.

Examples of a crosslinkable monomer (b) other than that stated in (a) above, which possesses in 1 molecule thereof 2 or more ethylenically unsaturated groups and which forms a constituent element of the crosslinking curable resin composition of the present invention, include: polyethylene glycol di(meth)acrylate, polypropylene glycol di(meth)acrylate, 1,4-butane diol di(meth)acrylate, 1,6-hexane diol di(meth)acrylate, neopenthyl glycol di(meth)crylate, 2,2-bis[4-(meth)acryloyloxypolyethoxyphenyl] propane, 2,2-bis [4-(meth)acryloyloxypolypropylene oxyphenyl] propane, hydroxypivalic neopenthyl glycol di(meth)acrylate, glycerin di(meth)acrylate, glycerine tri(meth)acrylate, trimethylol ethane di(meth)acrylate, trimethylol ethane tri(-meth)acrylate, trimethylol propane di(meth)acrylate, trimethylol propane tri(meth)acrylate, trimethylol propane tris[polyethoxy(meth)acrylate], isocyanuric triethylol di(meth)acrylate, isocyanuric triethylol tri(meth)acrylate, pentaerythritol di(meth)acrylate, pentaerythritol tri(meth)acrylate, pentaerythritol tetra(meth)acrylate, dipentaerythritol tri(meth)acrylate, dipentaerythritol tetra(meth)acrylate, dipentaerythritol penta(meth)acrylate, dipentaerythritol hexa(meth)acrylate, (meth)crylate types of polyatomic alcohols such as crosslinking monomers having 2 or more (meth)acryloyloxy groups for each molecule obtained by reacting (meth)acrylic acid or (meth)acrylic acid chloride with a reaction product in which less than 5 moles of propylene oxide were added per 1 mole of OH group to a polyatomic alcohol possessing 3 or more OH groups per molecule, and crosslinking, monomers having 2 or more (meth)acryloyl oxide groups per molecule obtained by the reaction of (meth)acrylic acid or (meth)acrylic acid chloride with a reaction product in which more than 12 moles of propylene oxide were added per 1 mole OH groups to a polyatomic alcohol having 3 or more OH groups per molecule, epoxy(meth)acrylate types having 2 or more functions, and urethane (meth)acrylate types having 2 or more functions; these may be used singly or in combination.

The crosslinkable monomer (b) other than that stated in (a) above, having 2 or more ethylenically unsaturated groups per molecule, to be used in the present invention, is contained in an amount of 5-30 wt % of the crosslinking curable resin composition of the present invention. A composition in which the amount of crosslinkable monomer contained is less than 5 wt % loses surface gloss upon development with alkaline aqueous solution. On the other hand, in the case in which a composition containing an amount of crosslinkable monomer greater than 30 wt % is used as a dry film resist, the superior antiplating properties which are an object of the present invention cannot be obtained.

Furthermore, from the point of view of the preservability of the dry film resist at high temperatures, that is to say, the resistance to cold flow, and from the point of view of conformability to irregularities in the substrate, it is preferable that 3-10 wt % of a compound having a viscosity of 5000 cps or more at a temperature of 25° C., and possessing OH groups in the molecules thereof, be used as portion of the crosslinkable monomer (b) other than that stated in (a) above, having 2 or more ethylenically unsaturated groups per molecule. That is to say, by means of the use of 3 or more wt % of a compound having a viscosity of 5000 cps or more at a temperature of 25° C. and containing OH groups in the molecules thereof, the resistance to cold flow at high temperatures can be guaranteed when compared with the case in which a compound containing less than 3 wt % thereof is used. On the other hand, in the case in which 10 or more wt % thereof are used, the viscosity of the composition increases rapidly, and the conformability to irregularities in the substrate at the time of lamination is decreased.

Various compounds which are commonly known in the field may be used as the compound used as a part of element (b) having a viscosity of 5000 cps or more at a temperature of 25° C. and possessing in the molecules thereof OH groups; examples thereof include dipentaerythritol pentaacrylate, phthalic acid bis (3-acryloyloxy, 2-hydroxypropyl) ester, and 1,2,3,tris(3acryloyloxy, 2-hydroxypropyloxy) propane.

In order that the binder thermoplastic polymer (c) constituting the crosslinking curable resin composition of the present invention be developable by means of a dilute alkaline aqueous solution such as sodium carbonate or the like, it is necessary that 1 or more α,β-unsaturated caboxyl groups containing monomoers having 3-15 carbon atoms be copolymerized in a proportion of 15-35 wt % as copolymerizing elements. Carbonic acid type monomers useful for this purpose include acrylic acid, methacrylic acid, cinnamic acid, crotonic acid, sorbic acid, itaconic acid, propionic acid, maleic acid, and fumaric acid; furthermore, the half-esters or anhydrides thereof may also be used. Among these, the most preferable compounds are acrylic acid and methacrylic acid. It is necessary that these carbonic acid type elements be used in amounts such that the amount contained in the copolymer is within a range of 15-35 wt %. When the amount of carbonic acid type element contained in the copolymer is less than 15 wt % development with a alkaline aqueous solution is either impossible or the development time becomes so long that definition is lost. On the other hand, when the amount of carbonic acid type elements contained in the copolymer exceeds 35 wt %, the photocured portion which is intended to remain as a pattern is subject to swelling or removal by means of the alkaline type development fluid, so that the development control necessary to obtain a high resolution pattern becomes difficult, and furthermore, the waterproof of the cured portion decreases.

Furthermore, it is preferable that this carbonic acid type constituent element be contained in the copolymer in an amount within a range of 15-23 wt %. By means of keeping the copolymerization ratio of the carbonic acid type constituent element below 23 wt %, it is possible to further improve the antiplating characteristics which are an object of the present invention.

As another copolymerizable component constituting the binder thermoplastic polymer (c) constituting the crosslinking curable resin composition of the present invention, it is preferable that 2-25 wt % of a second polymerizable compound group consisting of one or more compounds selected from the group consisting of the compounds shown in formula [I]

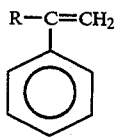

R—C=CH$_2$ [I]

(in the formula, reference R indicates H, an alkyl group possessing 1-6 carbon atoms or a halogen atom) or ring-substituted derivatives thereof be used;
furthermore, 10-40 wt % of a third polymerizable substance should preferably be used, this substance comprising one or more compounds selected from the group consisting of alkyl acrylate, in which the alkyl group possesses 1-8 carbon atoms, and hydroxyalkylacrylate, in which the hydroxyalkyl group possesses 2-8 carbon atoms;
and 30-70 wt % of a fourth polymeriazable substance should preferably be used, this substance consisting of one or more compounds selected from the group consisting of alkyl methacrylate, in which the alkyl group possesses 1-8 carbon atoms, and hydroxyalkyl methacrylate, in which the hydroxy alkyl group possesses 2-8 carbon atoms.

The second polymeriazable substance to be copolymerized with the binder thermoplastic polymer (c) is the compound shown in formula [I ] (in the formula, reference R represents H, an alkyl group possessing 1-6 carbon atoms, or a halogen atom) or a ring-substituted derivative thereof. Examples of substituents of the benzene ring include nitro groups, alkyl groups, alkoxy groups, acyl groups, carboxyl groups, sulfone groups, hydroxyl groups, or halogen or the like; the remaining substituents of the benzene ring should be in a range of 1-5. Single alkyl groups such as methyl or t-butyl groups are preferable as substituents. Among these compounds, the most preferable compound is styrene. It is preferable to copolymerize these second polymerizable components so as to be within a range of 2-5 wt % in the binder thermoplastic polymer, and more preferably within a range of 3-20 wt %. When the copolymerized amount of this component is less than 2 wt %, the superior resistance to chemicals, and particularly antiplating properties, tend not to be manifested, and on the other hand, when the amount of this component exceeds 25 wt %, the development time and stripping time of the dry film resist thus obtained become too long, the resolution of the dry film resist is lowered, and the productive efficiency of a circuit pattern tends to be reduced.

The third polymerizable substance contained in the binder thermoplastic polymer (c) is at least one of alkyl acrylate possessing an alkyl group having 1-8 carbon atoms, and hydroxy alkylacrylate possessing a hydroxyalkyl group having 2-8 carbon atoms. Examples of this compound include methyl acrylate, ethyl acrylate, n-propyl acrylate, iso-propylacrylate, n-butyl acrylate, sec-butyl acrylate, t-butyl acrylate, 2-hydroxyethyl acrylate, 2-hydroxy propyl acrylate, and 2-ethylhexylacrylate. Among these compounds, the most preferable are methyl acrylate, ethyl acrylate, n-butyl acrylate, and 2-ethylhexyl acrylate. These acrylate type components give an appropriate flexibility to the photopolymerizable or radiation curable resin composition of the present invention, so that it is preferable that these components be so copolymerized as to be with a range of 10-40 wt % in the binder thermoplastic polymer, and more preferably within a range of 15-35 wt %. If the amount of acrylate type component contained is less than 10 wt %, sufficiently flexible dry film resist will not be obtainable, and the adhesion to the substrate and conformability of the resist resin to irregularities in the substrate surface is insufficient, so that the antiplating properties and the antietching properties of the resist tend to worsen. On the other hand, when the copolymerized amount of this third polymerizable substance exceeds 40 wt %, the resin becomes too soft, and when the dry film resist thus obtained is stored on rollers, the resist resin tends over time to spread out from between the support film layers; in other words, the cold flow phenomenon occurs.

The fourth polymerizable substance which is copolymerized in the binder thermoplastic polymer (c) is copolymerized in combination with alkyl acrylate or hydroxyalkyl acrylate in order to give an appropriate Tg (glass transition temperature) to the binder thermoplastic polymer; it is at least one of alkylmethacrylate possessing an alkyl group having 1-8 carbon atoms and hydroxyalkyl methacrylate possessing a hydroxyalkyl group having 2-8 carbon atoms. Examples of this compound include methyl methacrylate, ethyl methacrylate, n-propyl methacrylate, iso-propylmethacrylate, n-butyl methacrylate, sec-butyl methacrylate, t-butyl methacrylate, 2-hydroxyethyl methacrylate, 2-hydroxypropyl methacrylate, and 2-ethylhexyl methacrylate.

Among these compounds, the most preferable compound is methyl methacrylate. This methacrylate component should be so copolymerized so as to be present in the binder thermoplastic copolymer within a range of 30–70 wt %, and more preferably within a range of 35–65 wt %.

Furthermore, it is preferable that the thermoplastic polymer (c) used in the present invention have a value [η] (intrinsic viscosity) within a range of 0.30–0.40 when measured using a dimethyl formamido-solution of 0.1 mol/l sodium thiocyanate as a solvent and a temperature of 25° C. When [η] exceeds a value of 0.40, there is a tendency for the antiplating properties of the resulting film resist to worsen somewhat, while on the other hand, when [η] has a value of less than 0.30, the cold flow phenomenon occurs easily when a dry film resist is produced.

In order to further increase the superior antiplating properties which are an object of the present invention, the maintenance of the amount of the carbonic acid component contained in the binder thermoplastic polymer (c) at a level below 23 wt % is effective, and it has been discovered that, furthermore, the maintenance of the value of [η] of the binder thermoplastic polymer (c) at a level below 0.40 increases the antiplating properties still further. Details of the mechanism thereof are as yet unclear; however, it seem that the soaking of plating fluid along the interface between the plating resist and the metal therebeneath, or along the resist membrane, the occurrence of the reaction shown in formula [II] at the interface between the plating resist and the metal therebeneath, and the destruction of this interface by means of the OH ions (alkali) produced thereby are the causes of his reduction in antiplating properties.

$$H_2O + 1/2O_2 + 2e^- \rightarrow 2OH^-  \qquad [II]$$

Accordingly, by means of keeping the value of [η] of the binder thermoplastic polymer below a specified value, the flexibility of the crosslinking curable resin composition of the present invention increases, and at the time of lamination onto the substrate, the resin conforms sufficiently to irregularities in the substrate surface, and the undesirable soaking of plating fluid along the interface can be prevented. In addition, by means of keeping the carbonic acid component in the binder thermoplastic polymer below a specified amount, swelling of the alkaline developable resist resin by means of the OH ions produced in formula [II] can be minimized, and as a result, the antiplating properties improve greatly.

Furthermore, in general, when the carbonic acid component in the binder thermoplastic polymer is reduced, the development time by means of dilute alkali aqueous solution becomes long; however, by means of keeping the value of the [η] of the thermoplastic polymer below a specified value and shortening the molecular chain of the binder thermoplastic polymer, the intertwining of molecular chains is reduced, and the dispersion of these chains in the dilute alkali solution is improved.

The binding thermoplastic polymer (c) used in the present invention is preferably present in a range of 45–75 wt % per 100 wt % of crosslinking curable resin composition and more preferably is present in a range of 50–70 wt %. The dry film resist obtained from a crosslinking curable resin composition containing less than 45 wt % of binder thermoplastic polymer cannot be used to form a film having a photosensitive layer, does not possess sufficient membrane strength, is subject to cold flow, and has a long stripping period. On the other hand, when the amount of this thermoplastic polymer which is contained exceeds 75 wt %, the cured membrane becomes brittle, conformability to the substrate surface and adhesion to the substrate itself are lost, sufficient resistance to chemicals, antiplating properties and antietching properties cannot be obtained, and furthermore, the gloss of the developed surface is lost.

The crosslinking curable resin composition of the present invention may be cured by means of various types of active energy rays. Examples of active energy rays useful for this purpose include, for example, ultraviolet radiation, visible radiation, electron beams, and the like. In the case in which curing is accomplished by means of ultraviolet radiation or visible radiation, photoinitiator (d) should be present in a range of 0.1–10 wt % per 100 wt % of the crosslinking curable resin composition. If the photoinitiator is present in an amount less than 0.1 wt %, curing will be insufficient, while if more than 10 wt % are present, the composition becomes unstable with respect to heat. When the crosslinking curable resin composition of the present invention is cured by means of an electron beam, there is no need to include a photoinitiator.

Examples of the photoinitiator (d) used at the time of curing of the crosslinking curable resin composition of the present invention include benzophenone, Michler's ketone, 4,4'bis(diethylamino)berzophenone, t-butyl anthraquinone, 2-ethyl anthraquinone, thioxantone types, benzoin alkyl ether types, benzylketal types, and the like; commonly known examples may be used singly or in combination.

In order to regulate the crosslinking density of the cured composition and to obtain an appropriate degree of flexibility, a polymerizable monomer having one ethylenically unsaturated group per molecule is added to the crosslinking curable resin composition of the present invention. Examples of such monomers include phenoxydiethoxy(meth)acrylate, methoxy polyethylene glycol (meth)acrylate, n-butoxymethyl acrylamide, isobutoxymethyl acrylamide, and the like; these may be used singly or in combination. It is preferable that amount of use of the polymerizable monomer possessing one ethylenically unsaturated group per molecule be within such a range that it not exceed the total amount of use of the compound (a) obtained from polyatomic alcohol possessing 3 or more OH groups per molecule and the crosslinking monomer (b) having 2 or more ethylenically unsaturated groups per molecule, which constitute the composition of the present invention. When the amount used exceeds the total of the amount (a) and (b) used, the flexibility of the resin composition which is obtained increases; however, the crosslinking density becomes too low, and the resistance to chemicals of the cured composition decreases.

In order to further increase the antiplating properties, tetrazole or derivatives thereof may be included in the crosslinking curable resin composition of present invention. The addition of a small amount of tetrazole or derivatives thereof enables an increase in adhesion to the metal surface; examples thereof include 1-phenyl tetrazole, 5-phenyl tetrazole, 5-amino benztetrazole, 5-amino-1-methyl tetrazole, 5amino-2-phenyl tetrazole, 5-mercapto-1-phenyl tetrazole, 5-mercapto-1-methyl tetrazole and the like; these may be used singly or in combination.

Compounds other than the tetrazole types described above, for example, benzotriazole, benzimidazole, or the like, may be used; however, in order to increase the antiplating properties by means of the use thereof, a large amount must be used in order to achieve superior effects, while if a large amount is used, the sensitivity of the crosslinking curable resin composition is reduced, the compounds remain on the copper surface after development or stripping and negatively affect the plating adhesion, and etching is also delayed, so that such compounds are not preferable. The amount of tetrazole or derivatives thereof should be within a range of 0.005–5 wt % with respect to 100 wt % of total amount of binder resin, crosslinking monomer, and photoinitiator. If the amount used is less than 0.005 wt %, a significant increase in antiplating properties cannot be seen, while when the amount used is greater than 5 wt %, a long period is needed for the dissolving thereof into the crosslinking curable resin composition and furthermore, the sensitivity of the crosslinking curable resin composition decreases. When necessary, components such as thermal polymerization inhibitor, dye, plasticizer, and filler may be added to the crosslinking curable resin composition of the present invention.

In the following, the method of use of the crosslinking curable resin composition of the present invention will be explained.

It is possible to utilize the crosslinking curable resin composition of the present invention in a uniformly dissolved solution form in which all components thereof are dissolved in a solvent with a relatively low boiling point, for example, acetone, methylethyl ketone, methyl Cellosolve, ethyl Cellosolve, dichloromethane, chloroform, methyl alcohol, ethyl alcohol, isopropyl alcohol, or the like, singly or in combination. The amount of solvent used should preferably be less than 200 wt % of crosslinking curable resin composition and, more preferably, within a range of 50–150 wt %.

As a first stage, a photosensitive layer comprising the crosslinking curable resin composition of the present invention is formed on a substrate.

The crosslinking curable resin composition of the present invention can be applied in a dissolved form to a substrate such as a copper plate or the like and then dried; however, it is also possible to apply the resin composition in dissolved form to a supporting film comprising polyethylene terephthalate or the like, to dry this to form a dry film resist, and to laminate this to a substrate which is a copper plate or the like to form a photosensitive layer. In forming a dry film resist using the crosslinking curable resin composition of the present invention, it is possible to use, for example, a blade coater, rod coater, knife coater, roll doctor coater, comma coater, reverse roll coater, transfer roll coater, gravure coater, kiss roll coater, curtain coater, and the like; however, it is necessary to volatilize the solvent. In the case in which flammable organic solvents are used, from the point of view of safety, drying may be accomplished using a forced-air type dryer operating by means of steam which is provided with a heat source, by means of counter-current contact with hot air within the dryer, or by means of the direction of hot air onto a support body from a nozzle. The form of the dryer, for example, an arch type, a flat type, or the like, may be freely selected to suit the desired object.

After the drying of the dry film resist, when necessary, a protective film of polyethylene or polypropylene may be laminated thereon.

The dry film resist can be employed in the form of a sheet and of a roll with a long length.

Various methods which are commonly known in the field may be used for the application of the dry film resist to the substrate; examples thereof include normal pressure thermocompression roll bonding, vacuum thermocompression roll bonding, and vacuum thermocompression press bonding.

Next, exposure of the photosensitive layer is conducted in order to form a pattern. Various methods commonly known in the field may be used as the exposure method; for example, ultraviolet radiation exposure, visible radiation exposure, and laser exposure may be used, and furthermore, it is possible to use photomasking or direct imaging as methods for selective exposure.

Next, the removal of uncured portions (unexposed portions) using an alkaline development liquid is conducted. Examples of the alkaline development liquid include, for example, an aqueous solution of sodium carbonate, an aqueous solution of sodium phosphate, and an aqueous solution of potassium carbonate; it is possible to add small amounts of antifoaming agents or surfactants to these aqueous solutions. Furthermore, among the removal methods, the most commonly used is the spray method; however, it is possible to partially substitute the immersion method for this method.

A dry film resist having a pattern formed thereon in the above manner has superior antiplating properties, and moreover, it is easily strippable, and the resistance of the stripped plate to dissolution is good, so that it is extremely useful for production.

EXAMPLES

Hereinbelow, explanation will be made c f examples and comparative examples of the present invention.

SYNTHESIS EXAMPLE 1

Synthesis of Compound (a) (A-1)

A 3-liter 3-mouthed flask was fitted with a stirrer, a Dean-Stark water-separator, an air inlet tube, and a thermometer, and to this was added 950 g of toluene, 0.4 g of P-methoxyphenol, 200 g of acrylic acid, 1220 g of a propylene oxide 25 mol reaction product of trimethylol propane, and 94 g of P-toluene sulfonic acid monohydrate. Next, while introducing air in small amounts, the pressure within the flask was increased to 300 Torr and when the temperature of the oil bath reached 110° C. while stirring, reflux began and the azeotropic water began to collect in the Dean-Stark water-separator. The reaction was continued in this state for 13 hours until the completion of water distillation. After this, the temperature within the flask was returned to room temperature, 4700 g of hexane was added to the reaction mixture, this was irrigated with 10 wt % of an aqueous solution of sodium hydroxide and with water, and then components having a low boiling point were removed by means of vaporization, and an acrylate (compound (a) (A-1)) of a 25 mol polypropylene oxide reaction product of trimethylol propane was obtained. The yield was 86 percent.

SYNTHESIS EXAMPLES 2–12

Synthesis of Compounds (a) (A-2 ~ A-12)

Using a method identical to that of Synthesis Example 1, polyatomic alcohol and acrylic acid were reacted in the proportions shown in Table 1, and the compounds (a) (A-2~A-12) shown in Table 2 were obtained.

TABLE 1

| Compound (a) | Polyatomic Alcohol | | Acrylic acid |
|---|---|---|---|
| A-2 | 18 mole propylene oxide reaction product of trimethylol propane | 910 g | 200 g |
| A-3 | 40 mole propylene oxide reaction product of pentaerythritol | 1420 g | 200 g |
| A-4 | 44 mole propylene oxide reaction product of dipentaerythritol | 1080 g | 200 g |
| A-5 | Reaction product in which 7.5 mole of ethylene oxide was added after adding 17.5 mole of propylene oxide to trimethylol propane | 1140 g | 200 g |
| A-6 | Reaction product in which 4.5 mole of ethylene oxide was added after adding 20.5 mole of propylene oxide to trimethylol propane | 1170 g | 200 g |
| A-7 | 11 mole propylene oxide reaction product of trimethylol propane | 600 g | 200 g |
| A-8 | 52 mole propylene oxide reaction product of pentaerythritol | 1820 g | 200 g |
| A-9 | 24 mole ethylene oxide reaction product of trimethylol propane | 920 g | 200 g |
| A-10 | Reaction product in which 10 mole of ethylene oxide was added after adding 15 mole of propylene oxide to trimethylol propane | 1110 g | 200 g |
| A-11 | 25 mole propylene oxide reaction product of trimethylol propane | 1220 g | 100 g |
| A-12 | 25 mole propylene oxide reaction product of trimethylol propane | 1220 g | 230 g |

TABLE 2

| Compound (a) | Structure | OH value (mgKOH/g) | Average acryloyloxy groups per molecule, calculated from the OH value |
|---|---|---|---|
| A-1 | Acrylate of a 25 mole reaction product of propylene oxide of trimethylol propane | 18.2 | 2.5 |
| A-2 | Acrylate of a 18 mole reaction product of propylene oxide of trimethylol propane | 53.0 | 1.8 |
| A-3 | Acrylate of a 40 mole reaction product of propylene oxide of pentaerythritol | 20.0 | 3.1 |
| A-4 | Acrylate of a 44 mole reaction product of propylene oxide of dipentaerythritol | 35.1 | 4.2 |
| A-5 | Acrylate of a reaction product in which 7.5 mole of ethylene oxide was added after adding 17.5 mole of propylene oxide to trimethylol propane | 21.5 | 2.4 |
| A-6 | Acrylate of a reaction product in which 4.5 mole of ethylene oxide was added after adding 20.5 mole of propylene oxide to trimethylol propane | 24.6 | 2.3 |
| A-7 | Acrylate of an 11 mole reaction product of propylene oxide of trimethylol propane | 64.6 | 2.0 |
| A-8 | Acrylate of a 52 mole reaction product of propylene oxide of pentaerythritol | 17.0 | 3.0 |
| A-9 | Acrylate of a 24 mole reaction product of ethylene oxide of trimethylol propane | 9.9 | 2.8 |
| A-10 | Acrylate of a reaction product in which 10 mole of ethylene oxide was added after adding 15 mole of propylene oxide to trimethylol propane | 7.0 | 2.8 |
| A-11 | Acrylate of a 25 mole reaction product of propylene oxide of trimethylol propane | 61.4 | 1.2 |
| A-12 | Acrylate of a 25 mole reaction product of propylene oxide of trimethylol propane | 7.3 | 2.8 |

SYNTHESIS EXAMPLE 13

Binder Thermoplastic Polymer B-1 Components

The following components were prepared

| (Polymerizable Monomers) | |
|---|---|
| Methacrylic acid | 50 g |
| Styrene | 20 g |
| Methyl acrylate | 50 g |
| Methyl methacrylate | 80 g |
| (Solvents) | |
| Methyl ethyl ketone | 100 g |
| Isopropyl alcohol | 220 g |
| (Polymerization initiator) | |
| Azobisbutylonitrile | 2 g |

A 100 ml 4-mouthed flask was provided with a nitrogen inlet, stirrer, condenser, and thermometer. Under a nitrogen atmosphere, all of the methacrylic acid, styrene, methyl acrylate, methyl methacrylate, and methyl ethyl ketone indicated above, were introduced, along with 140 g of isopropyl alcohol, and 0.4 g of azobisisobutylol nitrile, the temperature of the oil bath was raised to 80° C. while stirring, and polymerization was conducted for 2 hours at this temperature. Subsequently the remaining amount of azobisisobutylol nitrile was added in 5 equal aliquots at 1 hour intervals, the internal temperature of the flask was raised to the boiling point of the solvent, and a further polymerization was carried out at this temperature for 2 hours. After this, the temperature of the flask was allowed to return to 50° C., the remaining amount of isopropyl alcohol was added and the polymerized reaction product was removed from the flask, so that a solution of thermoplastic polymer B-1 was obtained. The polymerization percentage of the monomer mixture in thermoplastic polymer B-1 was more than 99.5% and the quantity of solids in the thermoplastic polymer solution was 38.7 wt %. Furthermore, the value of [η] for the thermoplastic polymer B-1 when measured at a temperature of 25° C. and using a 0.1 mol/liter solution of sodium thiocyanate in dimethylformamide was 0.43.

SYNTHESIS EXAMPLES 14–20

Synthesis of Binder Thermoplastic Polymers B-2~B-8)

Using 200 g of the monomers of the compositions shown in Table 3, and varying only the amounts of the azobisisobutylol nitrile and isopropyl alcohol which are initially set up, and otherwise conducting polymerization in a manner identical to that of Synthesis Example 9, solutions of the thermoplastic polymers B-2 ~B-8 were obtained. The polymerization percentage of the monomer mixture in each composition was more than 99.5% and the quantity of solids was 38.7 wt % in each case. Furthermore, the value of $[\eta]$ of each thermoplastic polymer was measured in a manner identical to that of Synthesis Example 9, and the results are shown in Table 3.

TABLE 3

| Thermo-plastic polymer | Polymerizable monomer composition (weight ratio) | | | | | |
|---|---|---|---|---|---|---|
| | Meth-acrylic acid | Sty-rene | Methyl acrylate | n-butyl acrylate | methyl meth-acrylate | $[\eta]$ |
| B-1 | 25 | 10 | 25 | — | 40 | 0.43 |
| B-2 | 25 | 5 | — | 15 | 55 | 0.42 |
| B-3 | 20 | — | 25 | — | 55 | 0.36 |
| B-4 | 20 | 30 | 20 | — | 30 | 0.37 |
| B-5 | 20 | 10 | 25 | — | 45 | 0.27 |
| B-6 | 20 | 10 | 25 | — | 45 | 0.37 |
| B-7 | 18 | 5 | — | 15 | 62 | 0.34 |
| B-8 | 13 | 5 | 30 | — | 52 | 0.43 |

EXAMPLES 1–18, COMPARATIVE EXAMPLE 1–11

Using the compounds (a) (A-1 ~A-12) and the thermoplastic polymers (B-1 ~B-8) obtained in the synthesis examples, photopolymerizable resin composition solutions possessing the compositions of Table 4 were prepared.

TABLE 4
(PARTS BY WEIGHT)

| | EXAMPLES | | | | | | | | | | | | | | | | | | COMPARATIVE EXAMPLES | | | | | | | | | | |
|---|---|---|---|---|---|---|---|---|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 1 | 2 | 3 | 4 | 5 | 6 | 7 | 8 | 9 | 10 | 11 |
| COMPOUND (a) (A-1) | 15 | | | | 8 | 25 | 15 | 10 | 15 | 15 | 15 | 15 | 15 | 15 | 15 | | | | | | | | | | 3 | 3 | 20 | 6 | 15 |
| COMPOUND (a) (A-2) | | 15 | | | | | | | | | | | | | | | | | | | | | | | | 32 | | | |
| COMPOUND (a) (A-3) | | | 15 | | | | | | | | | | | | | | | | | | 15 | | | | | | | | |
| COMPOUND (a) (A-4) | | | | 15 | | | | | | | | | | | | | | | | | | 15 | | | | | | | |
| COMPOUND (a) (A-5) | | | | | | | | | | | | | | | 15 | | | | | | | | 15 | | | | | | |
| COMPOUND (a) (A-6) | | | | | | | | | | | | | | | | 15 | 15 | | | | | | | 15 | | | | | |
| COMPOUND (a) (A-7) | | | | | | | | | | | | | | | | | | 15 | | 15 | | | | | | | | | |
| COMPOUND (a) (A-8) | | | | | | | | | | | | | | | | | | | 15 | | | | | | | | | | |
| COMPOUND (a) (A-9) | | | | | | | | | | | | | | | | | | | | | | | | | | | 30 | 10 | |
| COMPOUND (a) (A-10) | | | | | | | | | | | | | | | | | | | | | | | | | | | | | 20 |
| COMPOUND (a) (A-11) | | | | | | | | | | | | | | | | | | | | | | | | | | | | | |
| COMPOUND (a) (A-12) | | | | | | | | | | | | | | | | | | 15 | | | | | | | | | | | |
| KAYARAD D-310 *1 | | | | | | | | | | | | | | | | | | | 15 | | | | | | | | | | |
| TRIMETHYLOL PROPANE TRIACRYLATE | | | | | 2 | | | | | | | | | | | | | | | | | | | | | | | | |
| NK ESTER APG 400 *2 | 20 | 20 | 20 | 20 | 25 | 10 | 25 | 16 | 20 | 20 | 20 | 20 | 20 | 20 | 20 | 20 | 20 | 20 | 20 | 20 | 20 | 20 | 20 | 20 | 32 | | 30 | 10 | 20 |
| THERMOPLASTIC POLYMER B-1 | 58 | 58 | 58 | 58 | 58 | 58 | 53 | 67 | | | | | | | | | | | 58 | 58 | 58 | 58 | 58 | 58 | 58 | 58 | 43 | 77 | |
| THERMOPLASTIC POLYMER B-2 | | | | | | | | | 58 | | | | | | | | | | | | | | | | | | | | |
| THERMOPLASTIC POLYMER B-3 | | | | | | | | | | 58 | | | | | | | | | | | | | | | | | | | |
| THERMOPLASTIC POLYMER B-4 | | | | | | | | | | | 58 | | | | | | | | | | | | | | | | | | |
| THERMOPLASTIC POLYMER B-5 | | | | | | | | | | | | 58 | | | | | | | | | | | | | | | | | |
| THERMOPLASTIC POLYMER B-6 | | | | | | | | | | | | | 58 | | | | | | | | | | | | | | | | |
| THERMOPLASTIC POLYMER B-7 | | | | | | | | | | | | | | 58 | | | | | | | | | | | | | | | |
| THERMOPLASTIC POLYMER B-8 | | | | | | | | | | | | | | | 58 | 58 | 58 | 58 | | | | | | | | | | | |
| BENZOPHENONE | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 | 6.8 |
| MICHLER'S KETONE | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 |
| n-BUTOXYMETHYLACRYLAMIDE | | | | | | | | 10 | | | | | | | | | | | | | | | | | | | | | |
| 5-AMINO TETRAZOLE | | | | | | | | | | | | | | | | | 0.3 | | | | | | | | | | | | 20 |
| METHYLENE BLUE | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 |

(Note) The quantity of solids contained in each of the thermoplastic polymer solutions was 38.7 wt %; accordingly, the amount of thermoplastic polymer solution containing 43 parts by weight, 53 parts by weight, 58 parts by weight, 67 parts by weight, and 77 parts by weight of thermoplastic polymer is, respectively, 111 parts by weight, 137 parts by weight, 150 parts by weight, 173 parts by weight, and 199 parts by weight.

*1 Manufactured by Nippon Kayaku Co., Ltd.

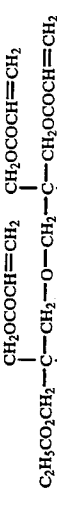
$CH_2OCOCH=CH_2$
$C_2H_5CO_2CH_2-C-CH_2-O-CH_2-C-CH_2OCOCH=CH_2$
$CH_2OCOCH=CH_2$ $CH_2OCOCH=CH_2$

*2 Manufactured by Shinnakamura Chemical Industrial Co., Ltd.
Polypropylene glycol #400 diacrylate The composition of the solution thus prepared was stirred in a propeller type mixer, was applied to a polyester film having a thickness of 25 μm with a coating width of 300 mm by means of a blade coater and was then dried in a counter-current hot air dryer having a length of 8 m to produce a photosensitive resin composition having a thickness of 50 μm. Next, a protective film comprising polyethyrene having a thickness of 35 μm was laminated on the dried membrane, this was then slit at a width of 250 mm and was wrapped onto rolls at a length of 120 m. These rolls were placed horizontally in a thermostatic chamber at a temperature of 23° C. for a period of 5 days, the state of cold flow from the ends of the roll was visually assessed, and the results thereof are shown in Table 5.

The application membrane surface of the dry film resist thus obtained was separated from the protective film and thermally laminated to the copper laminated plate, and after the temperature of the copper laminated plate has returned to room temperature, a phototool was applied to the polyester film surface and exposure was conducted by means of a super high pressure mercury lamp. An Ushio Electronics model USH-102D super high pressure mercury lamp was use, and exposure was conducted using an exposure amount such that 15 steps remained on a 25 step tablet manufactured by Mitsubishi Rayon Co., Ltd. The sample was left standing for 20 minutes after exposure, then the support film was stripped off, and development was conducted by means of a 1 wt % aqueous solution of sodium carbonate. The development was conducted under conditions such that the fluid temperature was 30° C., spray pressure was 1.4 kg/cm$^2$, and the distance between the spray and the substrate was 10 cm. At this time, a visual assessment was made as to whether the post-development cured resist surface was glossy or not, and the results thereof are shown in Table 5. Furthermore, with respect to Examples 1, 9–17 and Comparative Example 11, the dry film resist was submerged in developing fluid and the period of time necessary for the exposure of the copper surface of the substrate (shortest development period) was measured, and the results thereof are shown in Table 6.

Next, the substrate was immersed in a 20 vol % aqueous solution of the degreasing agent Enplate PC-55 (manufactured by Mertex Co.) for 5 minutes at a temperature of 40° C. and degreased, water spray irrigation was conducted for 1 minute, the substrate was subsequently immersed for 1 minute in a 20 wt % aqueous solution of ammonium persulfate, and then water spray irrigation was again conducted for 1 minute. Then, immersion was conducted for 1 minute in 10 vol % of sulfuric acid, and water spray irrigation was again conducted for 1 minute. Next, immersion was conducted for 1 minute in 10 vol % of sulfuric acid, and next immersion was conducted in a copper sulfate plating fluid, and copper plating was conducted for 30 minutes at 3.0 A/dm$^2$. The liquid temperature at this time was 22° C. After the completion of plating, water irrigation was carried out, immersion was conducted for 1 minute in a 5 weight parts aqueous solution of borofluoric acid, immersion was then carried out in a high throw solder plating liquid, and solder plating was conducted for 15 minutes at 1.8 A/dm$^2$. The liquid temperature at this time was 22° C. After the completion of plating, irrigation was carried out, and subsequently, drying was carried out. The antiplating properties of each dry film resist are shown in Table 5.

The composition of the copper plating liquid and solder plating liquid is as follows.

| (Copper plating liquid) | |
| --- | --- |
| Copper sulfate | 75 g/l |
| 98 wt % sulfuric acid | 100 ml/l |
| 36 wt % hydrochloric acid | 0.13 ml/l |
| Glossing agent | 5 ml/l |
| (Solder plating liquid) | |
| 45 wt % aqueous solution of borofluoric tin | 64 ml/l |
| 45 wt % aqueous solution of borofluoric lead | 22 ml/l |
| 42 wt % borofluoric acid | 200 ml/l |
| Boric acid | 20 g/l |
| Additive | 40 ml/l |

Using a sample on which solder plating had been completed, the resist was stripped using a 3 wt % aqueous solution of sodium hydroxide at a temperature of 45° C. The stripping was conducted under conditions such that the distance between the spray nozzle and the substrate was 10 cm, and the spray pressure was 1.0 kg/cm$^2$. The period of time necessary for the stripping of the resist was measured and the results thereof are shown in Table 5.

The stripped plate was recovered after the evaluation of the stripping, the plate was sealed in a beaker into which a 3 wt % aqueous solution of sodium hydroxide had been placed, this was placed in a thermostatic chamber at a temperature of 23° C. for a period of 1 week, and an examination was made to determine whether the stripped plate had dissolved or not. Results thereof are shown in Table 5.

TABLE 5

| | Cold flow | Surface gloss | Antiplating properties*[1] | Stripping time (seconds) | Stripping plate solubility |
| --- | --- | --- | --- | --- | --- |
| Example | | | | | |
| 1 | None | Good | ○ | 45 | Insoluble |
| 2 | None | Good | ○ | 50 | Insoluble |
| 3 | None | Good | ○ | 40 | Insoluble |
| 4 | None | Good | ○ | 45 | Insoluble |
| 5 | None | Good | ○ | 55 | Insoluble |
| 6 | None | Good | ○ | 50 | Insoluble |
| 7 | None | Good | ○ | 55 | Insoluble |
| 8 | None | Good | ○ | 50 | Insoluble |
| 9 | None | Good | ○ | 50 | Insoluble |
| 10 | None | Good | ○ | 45 | Insoluble |
| 11 | None | Good | ⊙ | 60 | Insoluble |
| 12 | Slight | Good | ⊙ | 55 | Insoluble |
| 13 | None | Good | ⊙ | 50 | Insoluble |
| 14 | None | Good | ⊙ | 55 | Insoluble |
| 15 | None | Good | ⊙ | 50 | Insoluble |
| 16 | None | Good | ⊙ | 50 | Insoluble |
| 17 | None | Good | ⊙ | 50 | Insoluble |
| 18 | None | Good | ⊙ | 51 | Insoluble |
| Comparative Example | | | | | |
| 1 | None | Good | △~X | 75 | Soluble |
| 2 | None | Good | △ | 65 | Insoluble |
| 3 | None | Poor | △ | 40 | Insoluble |
| 4 | None | Good | △ | 70 | Soluble |
| 5 | None | Good | △ | 65 | Soluble |
| 6 | None | Poor | △ | 45 | Insoluble |
| 7 | None | Good | △ | 70 | Soluble |
| 8 | None | Poor | ○~△ | 45 | Insoluble |
| 9 | Present | Good | ○ | 75 | Insoluble |
| 10 | None | Poor | X | 40 | Soluble |

TABLE 5-continued

| | Cold flow | Surface gloss | Antiplating properties[*1] | Stripping time (seconds) | Stripping plate solubility |
|---|---|---|---|---|---|
| 11 | None | Good | Δ | >100 | Insoluble |

[*1]Antiplating properties
◉: Extremely good
○: Good
○~Δ: Slight submerged plating (no problems in applied use)
Δ: Widespread submerged plating (problems in applied use)
Δ~X: Some plating shorts between pattern sections
X: Widespread plating shorts between pattern sections

TABLE 6

| Example | Development period (seconds) |
|---|---|
| 1 | 50 |
| 9 | 49 |
| 10 | 32 |
| 11 | 62 |
| 12 | 33 |
| 13 | 41 |
| 14 | 40 |
| 15 | 26 |
| 16 | 29 |
| 17 | 29 |
| Comparative Example 11 | >100 |

EXAMPLES 19–22

Using the compounds (a) (A-1) and the thermoplastic polymer B-6 obtained in the synthesis examples, photopolymerizable resin composition solutions containing the compositions of Table 7 were prepared.

These prepared composition solutions were applied and dried according to a method identical to that of Example 1, the lamination of protective film and slitting were conducted, and a roll having a width of 250 mm and a length of 120 m identical to that in Example 1 was created. The dry film resists thus obtained were evaluated for cold flow, surface gloss, and antiplating properties by a method identical to that of Example 1, and the conformability to irregularities in the substrate surface and anti-cold flow properties at a temperature of 33° C. were evaluated by a method described herein after. The results thereof are shown in Table 8.

Anti-Cold Flow Properties at 33° C.

The rolls were stored horizontally in a thermostatic chamber at a temperature of 33° C. for a period of 7 days, and the state of the cold flow from the ends of each roll was examined.

Conformability to Irregularities in the Substrate Surface

Metal engraving was carried out on a copper laminated plate having a thickness of 1.6 mm and copper layer of 35 μm, and a groove was created having a depth of 15 μm, width of 68 μm, and a length of 1 cm. Using a dry film laminator "Haruda-ML480D" made by MCK Co., the dry film was laminated at a roller temperature of 120° C. and at 1.5 m/min, and the groove was carefully examined for the presence of remaining air.

TABLE 7

| | Examples | | |
|---|---|---|---|
| | 20 | 21 | 22 |
| Compound (a) (A-1) | 15 | 15 | 15 |

TABLE 7-continued

| | Examples | | |
|---|---|---|---|
| | 20 | 21 | 22 |
| NK ester APG-400 [*1] | 20 | 16 | 12 | 7 |
| Denacol Acrylate DA721 [*2] | | 4 | 4 | |
| Denacol Acrylate DA314 [*3] | | | 4 | 13 |
| Thermoplastic polymer B-6 | 58 | 58 | 58 | 58 |
| Benzophenone | 6.8 | 6.8 | 6.8 | 6.8 |
| Michler's ketone | 0.2 | 0.2 | 0.2 | 0.2 |
| Victoria pure blue BOH | 0.02 | 0.02 | 0.02 | 0.02 |

[*1] Manufactured by Shinnakamura Chemical Industrial Co., Ltd.
Polypropylene glycol #400 diacrylate
25° C. 27 cps
[*2] Manufactured by Nagase Chemicals, Ltd.
Phthalic acid bis(3-acryloyloxy, 2-hydroxy)propyl ester

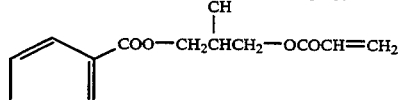

25° C. 100,000 cps

[*3] Manufactured by Nagase Chemicals, Ltd.
1,2,3,tris(3-acryloyloxy, 2-hydroxypropyloxy)propane

25° C. 11,000 cps

TABLE 8

| | Examples | | | |
|---|---|---|---|---|
| | 19 | 20 | 21 | 22 |
| Cold flow (23° C.) | None | None | None | None |
| Cold flow at high temperature (33° C.) | Present | None | None | None |
| Surface gloss | Good | Good | Good | Good |
| Antiplating properties [*1] | ◉ | ◉ | ◉ | ◉ |
| Conformability to irregularities in substrate surface [*2] | Good | Good | Good | Poor |

[*1] Antiplating properties
◉: Extremely good
○: Good
○~Δ: Slight submerged plating (no problems in applied use)
Δ: Widespread submerged plating (problems in applied use)
Δ~X: Some plating shorts between pattern sections
X: Widespread plating shorts between pattern sections
[*2] Conformability to irregularities in substrate surface
Good: Absence of remaining air
Poor: Presence of remaining air

What is claimed is:

1. A crosslinking curable resin composition of a combined gross weight of 100 parts by weight comprising:
   (a) 5–30 parts by weight of at least one compound possessing in one molecule on the average 1.5 or more (meth)acryloyloxy groups, which is obtained by reacting (meth)acrylic acid or chloride (meth)acrylate with a reaction product formed by adding, to a polyatomic alcohol possessing 3 or more OH groups in one molecule, an alkylene oxide of propylene oxide singly or formed from a combination of propylene oxide and ethylene oxide, with propylene oxide incorporated in an amount of 67% molar or greater, in the amount of 5–12 moles per mole of OH group in said polyatomic alcohol,
   (b) 5–30 parts by weight of at least one crosslinkable monomer other than that stated above in (a), possessing in one molecule 2 or more ethylenically unsaturated groups, (c) 45-75 parts by weight of a thermoplastic polymer for use as a binder, the thermoplastic polymer in turn being formed of 15-35 wt % of at least one α,β-unsaturate carboxyl group containing a monomer having 3-15 carbon atoms, and 65-85 wt % of another copolymerizable monomer, and (d) 0-10 parts by weight of a photopolymerization initiator.

2. A crosslinking curable resin composition according to claim 1, wherein said binder thermoplastic polymer (c) comprises 15-35 wt % of a first polymerizable substance comprising one or more monomers containing α,β-unsaturated carboxyl groups having 3-15 carbon atoms;

2-25 wt % of a second polymerizable substance comprising one or more compounds selected from a group 2consisting of compounds shown in formula

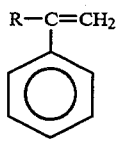

[I]

(in the formula, reference R indicates H, an alkyl group possessing 1-6 carbon atoms or a halogen atom) or ring-substituted derivatives thereof;

10-40 wt % of a third polymerizable substance comprising one or more compounds selected from a group 2consisting of alkyl acrylate, in which an alkyl group possesses 1-8 carbon atoms, and hydroxyalkylacrylate, in which a hydroxyalkyl group possesses 2-8 carbon atoms; and 30-70 wt % of a fourth polymerizable substance comprising one or more compounds selected from a group consisting of alkyl methacrylate, in which an alkyl group possesses 1-8 carbon atoms, and hydroxyalkylmethacrylate, in which a hydroxyalkyl group possesses 2-8 carbon atoms.

3. A crosslinking curable resin composition according to claim 2, wherein said binder thermoplastic polymer (c) comprises 15-35 wt % of a first polymerizable substance selected from a group consisting of acrylic acid and methacrylic acid, 2-25 wt % of styrene, 10-40 wt % of a third polymerizable substance comprising at least one compound selected from a group consisting of alkyl acrylates wherein an alkyl group possesses 1-8 carbon atoms, and 30-70 wt % of a fourth polymerizable substance comprising at least one compound selected from a group consisting of alkyl methacrylates in which an alkyl group possesses 1-8 carbon atoms.

4. A crosslinking curable resin composition according to claim 3, wherein said binder thermoplastic polymer (c) is comprising 15-23 wt % of methacrylic acid, 3-20 wt % of styrene 15-35 wt % of a third polymerizable substance comprising at least one group selected from a group consisting of alkyl acrylates wherein an alkyl group possesses 1-8 carbon atoms, and 35-65 wt % of methyl methacrylate.

5. A crosslinking curable resin composition according to any one of claims 1, 2, 3, or 4, wherein 3-10 parts by weight of a compound having a hydroxide group in a molecule thereof and having a viscosity of greater than 5000 cps at a temperature of 25° C. are used as a portion of said crosslinkable monomer (b) other than said component (a) having at least 2 ethylenically unsaturated groups in one molecule thereof.

* * * * *